United States Patent
Dishman et al.

(10) Patent No.: US 8,120,300 B2
(45) Date of Patent: Feb. 21, 2012

(54) FAULT TOLERANT COOLING IN A REDUNDANT POWER SYSTEM

(75) Inventors: C. Charles Dishman, Raleigh, NC (US); Ted A. Howard, Cary, NC (US); Randhir S. Malik, Cary, NC (US); Trung M. Nguyen, Morrisville, NC (US)

(73) Assignee: International Business Machines Corporation, Armonk, NY (US)

( * ) Notice: Subject to any disclaimer, the term of this patent is extended or adjusted under 35 U.S.C. 154(b) by 517 days.

(21) Appl. No.: 12/346,365

(22) Filed: Dec. 30, 2008

(65) Prior Publication Data

US 2010/0164427 A1 Jul. 1, 2010

(51) Int. Cl.
*G05D 23/00* (2006.01)
*H02H 7/08* (2006.01)
*H05K 7/20* (2006.01)

(52) U.S. Cl. ........ 318/471; 318/708; 318/564; 361/688; 361/695

(58) Field of Classification Search .......... 318/599, 318/811, 471, 708, 783, 563, 564; 361/688, 361/695
See application file for complete search history.

(56) References Cited

U.S. PATENT DOCUMENTS

| | | | |
|---|---|---|---|
| 5,436,827 A | 7/1995 | Gunn et al. | |
| 5,668,532 A | 9/1997 | Beer et al. | |
| 5,949,646 A * | 9/1999 | Lee et al. | 361/695 |
| 6,368,064 B1 * | 4/2002 | Bendikas et al. | 417/2 |
| 6,563,706 B1 | 5/2003 | Strickler | |
| 6,757,774 B1 | 6/2004 | Benson et al. | |
| 6,932,696 B2 * | 8/2005 | Schwartz et al. | 454/184 |
| 7,132,809 B1 * | 11/2006 | Chang | 318/400.13 |
| 7,287,708 B2 * | 10/2007 | Lucas et al. | 236/49.3 |
| 7,322,799 B2 * | 1/2008 | Robertson et al. | 417/16 |
| 7,538,453 B1 * | 5/2009 | Roux et al. | 307/86 |
| 2003/0209945 A1 | 11/2003 | Hanson | |
| 2003/0234625 A1 * | 12/2003 | Frankel et al. | 318/268 |
| 2004/0001311 A1 * | 1/2004 | Doblar et al. | 361/687 |
| 2004/0153786 A1 | 8/2004 | Johnson et al. | |
| 2010/0066172 A1 * | 3/2010 | Lv et al. | 307/64 |

OTHER PUBLICATIONS

Beer, R et al., Smart Configuration Unit, • TDB v38 n7 Jul. 1995 p. 175-176.

* cited by examiner

*Primary Examiner* — Eduardo Colon Santana
(74) *Attorney, Agent, or Firm* — Kunzler Needham Massey & Thorpe

(57) ABSTRACT

An apparatus, system, and method are disclosed for fault tolerant cooling in a redundant power system. The apparatus receives power from a common power bus to power one or more power supply fans. The apparatus detects a non-functioning redundant power supply. The apparatus receives a fan control signal within a non-functioning redundant power supply. In addition, the apparatus uses the received fan control signal to synchronize a fan speed of a power supply fan within the non-functioning redundant power supply. The fan speed is synchronized with at least one fan control signal of a power supply fan within a functioning redundant power supply. Thus, the power supply fans of a non-functioning power supply continue to operate and are synchronized with power supply fans in functioning power supplies.

20 Claims, 6 Drawing Sheets

FAULT TOLERANT COOLING IN A REDUNDANT POWER SYSTEM

BACKGROUND

1. Field of the Invention

This invention relates to the field of power supplies, and particularly to fault tolerant cooling in a redundant power system.

2. Description of the Related Art

A power system that provides power to an electronic device often includes multiple power supplies in parallel. This type of redundant power system provides for uninterrupted power generation even if one or more of the power supplies fail or cease to fully function. The multiple power supplies typically power a common bus which powers an electronic load for the components of the electronic device.

The internal components of a power supply and the components of an electronic device that receives power from a power system can generate a great deal of heat. Without appropriate cooling, these components can overheat and fail. Fans are commonly used in power supplies to provide cooling and are often integrated into and powered by the power supply in which the fans reside.

However, because the integrated fan is powered by the power supply, if the power supply fails or becomes non-functioning, the fan, which is still functional, will also stop running because the fan loses its power source. As a result, the components in the electronic device will run hotter than normal temperature due to the absence of a working fan. In addition, in a redundant power system with multiple power supplies, if a power supply fails, the overall efficiency of the entire cooling system may also suffer. This is often due to air blown by the fans from the other functioning power supplies traveling back through the non-functioning power supply instead of travelling through the electronic device. Without the air pressure caused by air being pushed through the non-functioning power supply by a fan, the non-functioning power supply may become the path of least resistance for air travel, thus decreasing the effectiveness of the functioning fans.

BRIEF SUMMARY

From the foregoing discussion, it should be apparent that a need exists for an apparatus, system, and method that provides for fault tolerant cooling in a redundant power system. Beneficially, such an apparatus, system, and method would allow fans in a non-functioning power supply to continue operating.

The present invention has been developed in response to the present state of the art, and in particular, in response to the problems and needs in the art that have not yet been fully solved by currently available power supply cooling systems. Accordingly, the present invention has been developed to provide an apparatus, system, and method for a cooling arrangement in a redundant power system that overcome many or all of the above-discussed shortcomings in the art.

In one embodiment, the apparatus includes a receiving module that receives power from a common power bus to power one or more pulse-width modulated ("PWM") power supply fans. The common power bus receives power from two or more redundant power supplies. In addition, the common power bus powers at least an electronic load and the one or more PWM power supply fans. Each of the one or more PWM power supply fans cools at least a redundant power supply in which the PWM power supply fan resides and components within an electronic device. The components include the electronic load.

The apparatus also includes a detection module that detects a non-functioning redundant power supply. In addition, the apparatus includes a signal module that receives a fan control signal within a non-functioning redundant power supply. Furthermore, the apparatus also includes a synchronization module that uses the received fan control signal to synchronize a fan speed of one or more PWM power supply fans within the non-functioning redundant power supply. The fan speed is synchronized with at least one fan control signal of a PWM power supply fan within a functioning redundant power supply.

The apparatus for fault tolerant cooling in a redundant power system, in one embodiment, is provided with a plurality of modules configured to functionally execute the necessary steps. These modules in the described embodiments include a receiving module, a detection module, a signal module, and a synchronization module. In one embodiment, the receiving module receives power from a common power bus to power one or more power supply fans. The common power bus receives power from two or more redundant power supplies and powers at least an electronic load and the one or more PWM power supply fans. In one embodiment, the detection module detects a non-functioning redundant power supply.

In one embodiment, the signal module receives a fan control signal within a non-functioning redundant power supply. The synchronization module uses the received fan control signal to synchronize a fan speed of one or more power supply fans within the non-functioning redundant power supply. The fan speed is synchronized with at least one fan control signal of a power supply fan within a functioning redundant power supply. Thus, the one or more fans of a non-functioning power supply continue to operate and are synchronized with the other fans.

In one embodiment, the apparatus includes a switching module that switches to the received fan control signal such that the non-functioning redundant power supply uses the received fan control signal to govern fan speed of the one or more power supply fans in the non-functioning redundant power supply. In another embodiment, the received fan control signal is a master fan control signal. The master fan control signal synchronizes a fan speed of one or more power supply fans residing in one or more of the redundant power supplies.

In another embodiment, the apparatus includes a designation module that designates a fan control signal of a power supply fan within a functioning redundant power supply as a master fan control signal in response to detecting a non-functioning redundant power supply. The non-functioning redundant power supply generated the master fan control signal prior to becoming non-functioning.

In further embodiments, the non-functioning redundant power supply generating the master fan signal prior to becoming non-functioning receives the newly designated master fan control signal and uses the received master fan control signal to synchronize a fan speed one or more power supply fans within the non-functioning redundant power supply. In one embodiment, each power supply fan comprises a pulse-width modulated (PWM) fan.

In certain embodiments, the fan control signal transmits pulse-width information and a fan controller of a power supply fan uses the pulse-width information in the fan control signal to generate a pulse-width modulated fan drive signal.

The fan drive signal causes the fan to move at a speed corresponding to a duty cycle of the pulse-width modulated signal.

Furthermore, the fan control signal may be a digital signal or an analog signal. In another embodiment, the fan control signal is a pulse-width modulated fan drive signal. The fan drive signal causes the power supply fan to move at a speed corresponding to a duty cycle of the pulse-width modulated fan drive signal.

Finally, in certain embodiments, each redundant power supply includes a microcontroller that receives a fan control signal and generates a pulse-width modulated fan drive signal. The fan drive signal causes the one or more power supply fans residing in each redundant power supply to move at a speed corresponding to a duty cycle of the pulse-width modulated fan drive signal.

A system of the present invention is also presented for fault tolerant cooling in a redundant power system. The system, in one embodiment, includes an electronic device including one or more components. The one or more components are an electronic load. The system also includes a common power bus that receives power from two or more redundant power supplies. The common power bus powers at least an electronic load and one or more power supply fans. The system also include two or more redundant power supplies that receive input voltage from a power source and provide a regulated output voltage to the electronic load. Each redundant power supply includes one or more power supply fans. Each redundant power supply may also include a receiving module, a detection module, a signal module, and a synchronization module described above.

A method of the present invention is also presented for fault tolerant cooling in a redundant power system. The method in the disclosed embodiments substantially includes the steps necessary to carry out the functions presented above with respect to the operation of the described apparatus and system. In one embodiment, the method includes receiving power from a common power bus to power one or more power supply fans and detecting a non-functioning redundant power supply. The method may also include receiving a fan control signal within a non-functioning redundant power supply and using the received fan control signal to synchronize a fan speed of one or more power supply fans within the non-functioning redundant power supply.

In one embodiment, the method includes switching to the received fan control signal such that the non-functioning redundant power supply uses the received fan control signal to govern fan speed of the one or more power supply fans in the non-functioning redundant power supply. In another embodiment, the received fan control signal comprises a master fan control signal. The master fan control signal synchronizes a fan speed of one or more power supply fans residing in one or more of the redundant power supplies.

In another embodiment, the method includes designating a fan control signal of a power supply fan within a functioning redundant power supply as a master fan control signal in response to detecting a non-functioning redundant power supply. The non-functioning redundant power supply generated the master fan control signal prior to becoming non-functioning. In one embodiment, the non-functioning redundant power supply generating the master fan signal prior to becoming non-functioning receives the newly designated master fan control signal and uses the received master fan control signal to synchronize a fan speed one or more power supply fans within the non-functioning redundant power supply.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION

Figure 1:
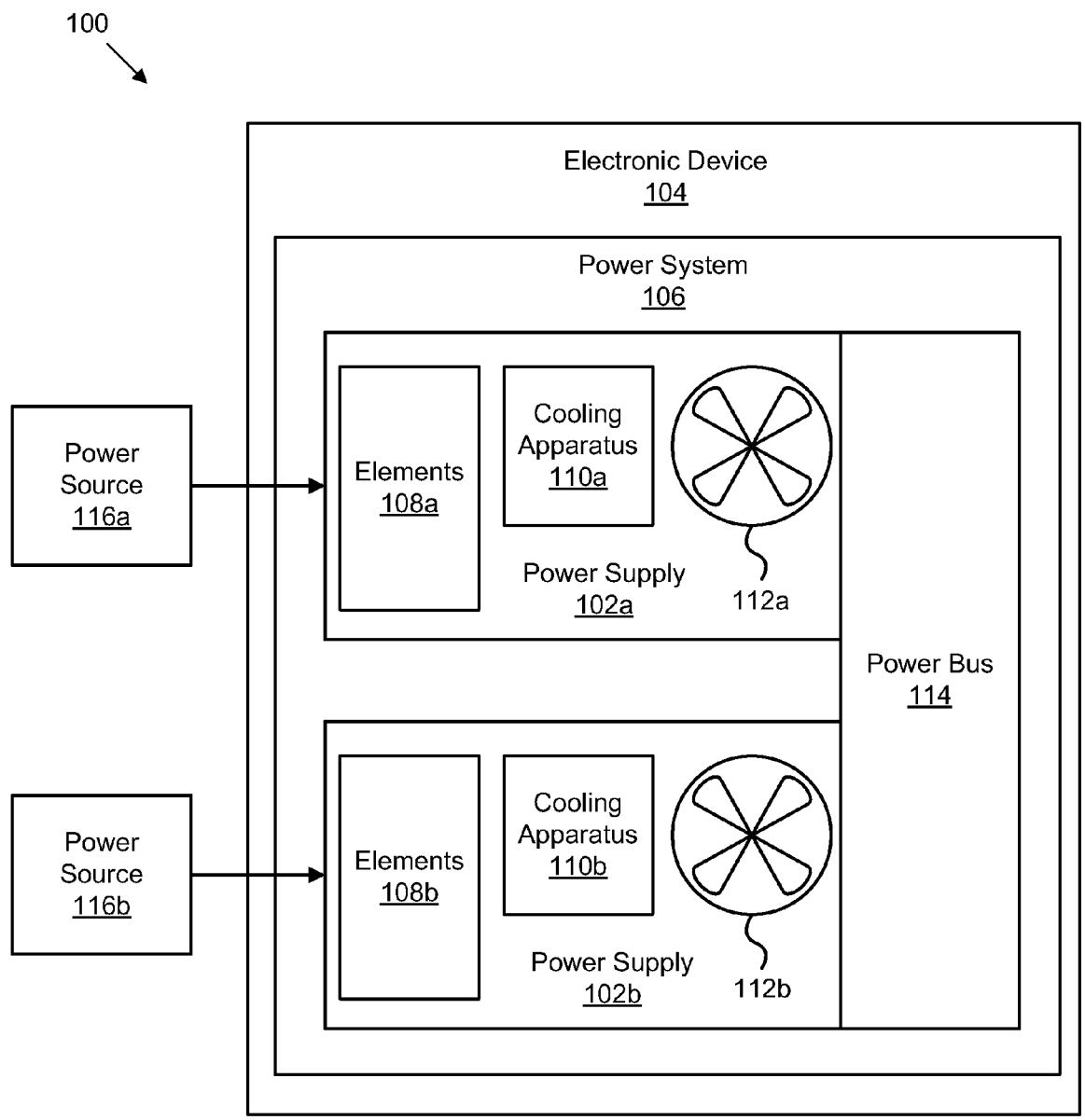
FIG. 1 is a schematic block diagram illustrating one embodiment of a system in accordance with the present invention.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more computer readable media.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Reference to a computer readable medium may take any form capable of storing machine-readable instructions on a digital processing apparatus. A computer readable medium may be embodied by a transmission line, a compact disk, digital-video disk, a magnetic tape, a Bernoulli drive, a magnetic disk, a punch card, flash memory, integrated circuits, or other digital processing apparatus memory device.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

FIG. 1 depicts a system 100 in accordance with the present invention. The system 100 includes an electronic device 104, a redundant power system 106 with multiple redundant power supplies 102 coupled to a common power bus 114, and multiple power sources 116 supplying power to each redundant power supply 102. The electronic device 104 is a device that receives power from the power system 106. The electronic device 104 and its components are an electronic load for the power system 106. For example, the electronic device 104 may be a computer (such as a laptop or a desktop computer), a blade server system, an appliance, or the like. Furthermore, in certain embodiments, the power system 106 is external to the electronic device 104.

The power system 106 includes multiple redundant power supplies 102. While FIG. 1 depicts two redundant power supplies 102, any number of redundant power supplies 102 may be used. Each power supply 102 receives power from a power source 116 and conditions the signal such that it arrives in a form suitable for use by the electronic device 104. Depending on the needs of the electronic device 104, the power system 106 may provide a DC or an AC output. Each power supply 102 is made up of various elements 108 that allow the power supply 102 to condition the signal and provide appropriate output for the electronic device 104. The elements 108 may be MOSFETs, BJTs, inductors, capacitors, resistors, transformers, integrated circuits, and other common electrical components found in power supplies.

The power supplies 102 power a common power bus 114 which in turn, powers the electronic device 104. Each power source 116 provides an input signal to the corresponding power supply 102. The power source 116 can be any source of electric power known in the art. For example, the power source 116 may be a generator or a standard electrical outlet. Each power source 116 may provide the corresponding power supply 102 with either a DC or AC input.

The components in the electronic device 104 and each power supply 102 generate heat which may damage the power supplies 102 or the electronic device 104. Therefore, each power supply 102 includes an integrated power supply fan 112 to help cool the power supply 102 and components within the electronic device 104. As is known by one of ordinary skill in the art, each power supply 102 may include multiple fans 112.

In accordance with the present invention, each power supply 102 includes a cooling apparatus 110 that provides for fault tolerant cooling in the redundant power system 106. Specifically, the cooling apparatus 110 enables the power supply fan 112 in the power supply 102 to continue functioning even if the power supply 102 fails or is non-functioning. Furthermore, the cooling apparatus 110 also synchronizes the fan 112 in the non-functioning power supply 102 with fans 112 in functioning power supplies 102 to maintain consistent fan speed throughout the power system 106. Therefore, the cooling apparatus 110 maintains consistent airflow and cooling power even if one or more of the power supplies 102 are rendered non-functioning. In addition, without one or more power supplies 102 without functioning fans 112, the air will escape through the non-functioning power supply 102.

Figure 2:
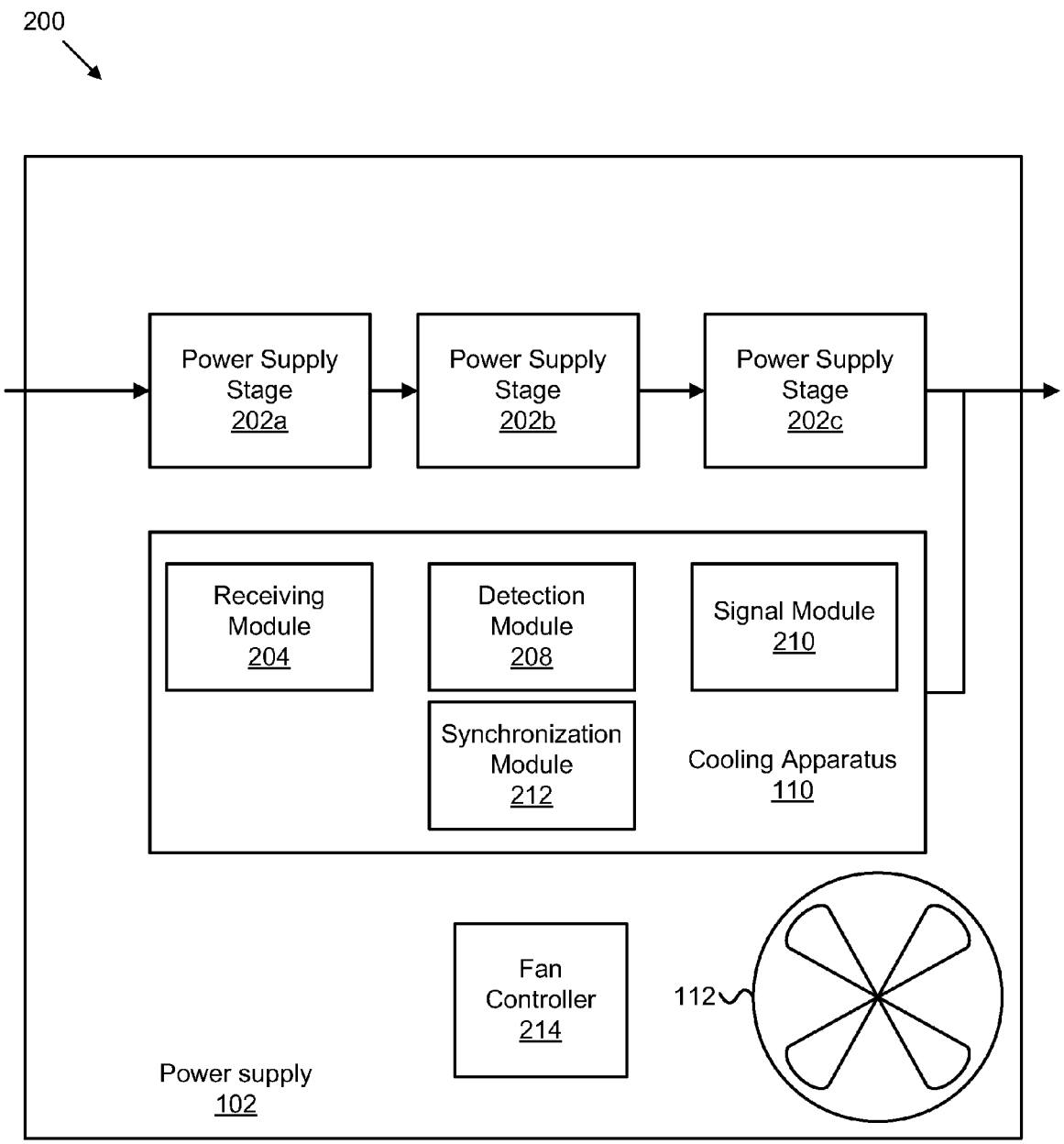
FIG. 2 is a schematic block diagram illustrating one embodiment of a cooling apparatus in accordance with the present invention.

FIG. 2 illustrates one embodiment of a power supply 102 that includes a cooling apparatus 110. In the depicted embodiment, the power supply 102 is a multi-stage power supply 102 that includes power supply stages 202*a-c*. The power supply stages 202*a-c* may provide a variety of functions for the power supply 102 such as signal rectification, filtering, power factor correction, and others. Power supply stages 202a-c may be, for example, boosts, bucks, buck-boosts, flybacks, Ćuks, combinations thereof, and other topologies known to those in the art. In certain embodiments, the power supply 102 may have a single power supply stage 202a or any other number of power supply stages 202a-n.

As shown, the cooling apparatus 110 includes a receiving module 204, a detection module 208, a signal module 210, and a synchronization module 212. The receiving module 204 receives power from a common power bus 114 to power one or more power supply fans 112.

The detection module 208 detects a non-functioning redundant power supply 102. A power supply is non-functioning when a failure occurs, when the power supply 102 ceases to transmit power to the common bus, or when the power supply 102 otherwise functions abnormally. The detection module 208 may detect a non-functioning power supply by measuring voltage within the power supply 102. A non-functioning power supply is indicated if the voltage falls below a threshold level. The detection module 208 may measure the voltage using resistors in a voltage divider, an isolation transformer, optical coupler, or other voltage measurement approach known to those in the art.

The detection module 208 may also receive a non-functioning power supply signal from another device that detects a non-functioning power supply. For example, a switch or other component in a power supply may fail and a controller may send a signal to the detection module 208. In another embodiment, the detection module 208 is integral with a power supply controller that determines that the power supply is non-functioning. In yet another embodiment, the detection module 208 detects a non-functioning power supply when the power supply 102 is turned off or if a power source 116 feeding the power supply 102 fails or is shut off. In one embodiment, the detection module 208 determines a non-functioning power supply by detecting any condition where the power supply 102 is not providing regulated power to the power bus 114.

The signal module 210 receives a fan control signal within a non-functioning redundant power supply 102. The received fan control signal may be the fan control signal of a fan 112 in a functioning power supply 102. In one embodiment, the functioning power supply 102 where the received fan control signal originates is a neighboring power supply 102b to the non-functioning power supply 102a, is an arbitrary functioning power supply 102, or is predetermined based on power supply performance, hardware quality, or the like.

In one embodiment, the power system 106 may include a master fan control signal that governs the fan speeds all fans 112 in the power system 106. Therefore, in certain embodiments, the received fan control signal is the master fan control signal that governs the fan speed of multiple power supply fans 112 residing in multiple redundant power supplies 102. The master fan control signal may govern the fan speed of every fan 112 in the power system 106 even under standard operating conditions (without power supply failures). In another embodiment, the master fan control signal governs the fan speed of a fan 112 only when the power supply 102 is non-functioning in which the fan 112 resides.

The master fan control signal, in one embodiment, is generated from the cooling apparatus 110 of a designated power supply 102. The designated power supply 102 may be randomly selected to generate the master fan control signal. In addition, the designated power supply 102 may be predetermined to generate the master fan control signal based on a hardware profile of the designated power supply 102, performance characteristics of the designated power supply 102, and the like.

In one embodiment, the fan control signal transmits pulse-width information and the power supply fan 112 and associated fan controller 214 make up a pulse-width modulated ("PWM") fan. A PWM fan controls fan speed by rapidly switching the power to the fan 112 on and off. The relative on/off time determines the average voltage seen by the fan 112 and, thus, its speed. For example, a fan 112 driven by a 12 Volt supply may have the fan controller 214 switching the 12 V supply on and then off for equal amounts of time. With this 50% on, 50% off supply, the fan 112 will see an average voltage of 6 V and operates at half-speed if speed is a linear relationship to voltage. The power supply fan 112 may have linear or non-linear speed/voltage relationship. Changing the on/off ratio changes the average voltage seen by the fan 112, and thus, changes the speed of the fan 112.

Therefore, in certain embodiments, the fan control signal transmits this pulse-width information that dictates the relative on/off time determination. A fan controller of a power supply fan 112 uses the pulse-width information in the fan control signal to generate a pulse-width modulated fan drive signal. The fan drive signal causes the power supply fan 112 to move at a speed corresponding to a duty cycle of the pulse-width modulated signal. As is known by one of ordinary skill in the art, the duty cycle is the fraction of time that the signal is in the active state. The fan control signal may be a digital signal and may have pulse-width information encoded in the digital signal. The fan control signal may also be an analog signal such as a variable voltage signal that can be converted to a pulse-width modulated signal or can be used to control a non-PWM fan. A pulse-width modulated signal may be adjusted for a non-linear speed/voltage relationship.

Furthermore, in one embodiment, the fan control signal is a pulse-width modulated fan drive signal capable of directly driving the power supply fan 112 instead of merely a control signal that conveys pulse-width information only. In the embodiment, the fan drive signal causes the power supply fan 112 to move at a speed corresponding to the duty cycle of the pulse-width modulated fan drive signal. In a further embodiment, the fan control signal is a tachometer signal of a fan 112 in a functioning power supply 102.

The synchronization module 212 uses the received fan control signal to synchronize a fan speed of one or more power supply fans 112 within the non-functioning redundant power supply 102. The synchronization module 212 synchronizes the fan speed with at least one fan control signal of a power supply fan 112 within a functioning redundant power supply 102. As stated above, the fan control signal may convey pulse-width information. Therefore, the synchronization module 212 may use the pulse-width information of another power supply fan 112 in a functioning power supply 102 to govern the speed of the fan or fans 112 in the non-functioning power supply 102. In one embodiment, the synchronization module 212 synchronizes the power supply fan 112 within the non-functioning redundant power supply 102 using the master fan control signal. In another embodiment, the master fan control signal governs the speed of all fans 112 in the entire power system 106.

Figure 3:
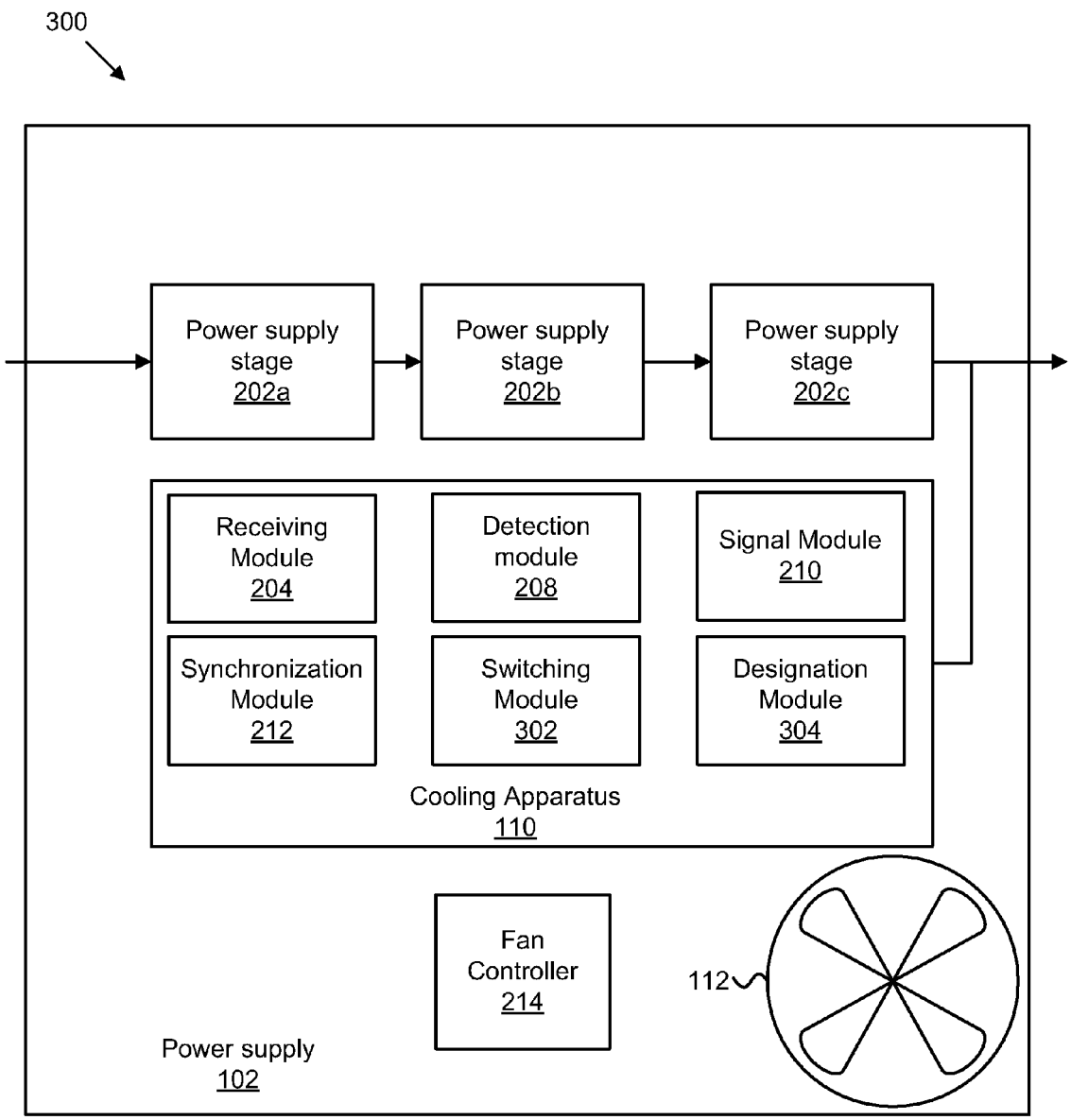
FIG. 3 is a detailed schematic block diagram illustrating one embodiment of a cooling apparatus in accordance with the present invention.

The master fan control signal, in one embodiment, is controlled by factors such as temperature sensors and power measurements. Furthermore, these factors may be measured only in a functioning power supply 102, in a functioning power supply 102 and electronic device 104, or in some combination of non-functioning power supply 102, functioning power supply 102, and electronic device 104. For example, if the temperature rises above a threshold level in a functioning power supply, the master fan control signal may be adjusted to increase fan speed of all fans in the power system 106. FIG. 3 illustrates a second embodiment of a power supply 102 that includes a cooling apparatus 110 in accordance with the present invention. The cooling apparatus 110 includes the receiving module 204, the detection module 208, the signal module 210, and the synchronization module 212, which are substantially similar to those described above with relation to the apparatus 200 of FIG. 2.

In addition, the cooling apparatus 110 also includes a switching module 302 and a designation module 304. The switching module 302 switches to the received fan control signal such that the non-functioning redundant power supply 102 uses the received fan control signal to govern fan speed of the one or more power supply fans 112 in the non-functioning redundant power supply 102. In one embodiment, the switching module 302 allows the speed of the fans 112 in the non-functioning redundant power supply 102 to be governed by another fan control signal altogether instead of interpreting an outside signal for fan speed information. The switching module 302 may be used when the fan control signal is a pulse-width modulated fan drive signal as mentioned above. Furthermore, the switching module 302 may also be used for non-PWM fans such as a fan with an analog signal.

The designation module 304 designates a fan control signal of a power supply fan 112 within a functioning redundant power supply 102 as a master fan control signal. The designation module 304 may designate this new master fan control signal in response to detecting a non-functioning redundant power supply 102 that generated the master fan control signal prior to becoming non-functioning. Therefore, if the designated power supply 102 that generates the master control signal fails or ceases to function, the designation module 304 can designate another power supply 102 to provide the master control signal thereby allowing for uninterrupted transmission of a master fan control signal.

Furthermore, the power supply fans 112 in the non-functioning power supply 102 that formerly generated the master control signal may also need to be synchronized. Therefore, the non-functioning redundant power supply 102 that generates the master fan signal prior to becoming non-functioning may receive the newly designated master fan control signal and use the received master fan control signal to synchronize the fan speed of the one or more power supply fans 112 within the non-functioning redundant power supply 102.

Figure 4:
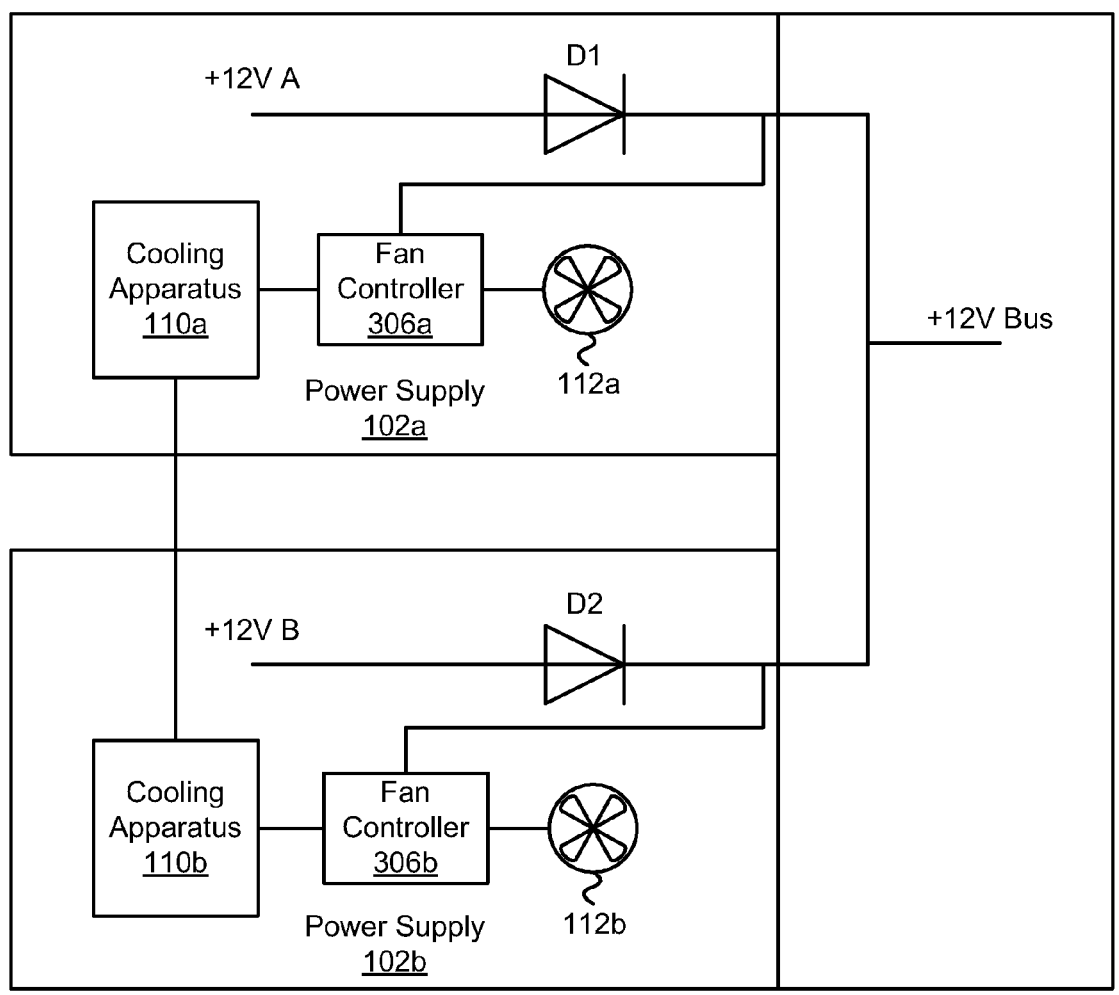
FIG. 4 is a schematic block diagram illustrating one embodiment of an implementation of a power system with a cooling apparatus in accordance with the present invention.

FIG. 4 illustrates one embodiment of a power system 400 having a cooling apparatus 110 as described above. The power system 400 includes redundant power supplies 102 that make use of diodes (D1 and D2) to restrict current flow in one direction toward the common power bus (+12 V Bus). Furthermore, the power supplies 102 receive power from +12V power inputs which power the common power bus +12 V Bus. As shown in FIG. 4, the power supply fans 112 are connected to a power source beyond each diode D1, D2. Therefore, the power supply fans 112 receive their power from the common power bus +12 V Bus. If one power supply 102a becomes non-functioning, the fan 112a residing in the non-functioning power supply 102a will still operate. In one embodiment, the cooling apparatus 110a in the non-functioning power supply 102a will synchronize the speed of the fan 112a in the non-functioning power supply 102a with the fan speed of the fan 112b in the functioning power supply 102b as explained above.

In one embodiment, the cooling apparatus 110 of one power supply 102a is connected to the cooling apparatus 110 of another power supply 102b. This connection facilitates the communication of the fan control signal from a functioning power supply 102b to a non-functioning power supply 102a. In another embodiment, the master fan control signal is transmitted between the cooling apparatus 110 in each power supply 102. Alternatively, the fan controller of one power supply 102a may be connected to the fan controller of another power supply 102a to convey the fan control signal. In one embodiment, the power supply fans 112 are connected between power supplies 102 to transmit and exchange the fan control signal.

Although FIG. 4 illustrates a cooling apparatus 110 in each power supply 102, in one embodiment, the power system 400 may have a single cooling apparatus 110 that transmits the master fan control signal to all fans 112 in the power system 400. In another embodiment, a cooling apparatus 110 may reside in a predetermined number of power supplies 102 to govern fan speed for a group of power supplies 102. One of ordinary skill in the art recognizes the variety of configurations available to manage the cooling strategy described above. In addition, although FIG. 4 depicts a single fan 112 in each power supply 102, each power supply 102 may include multiple fans 112.

Figure 5:
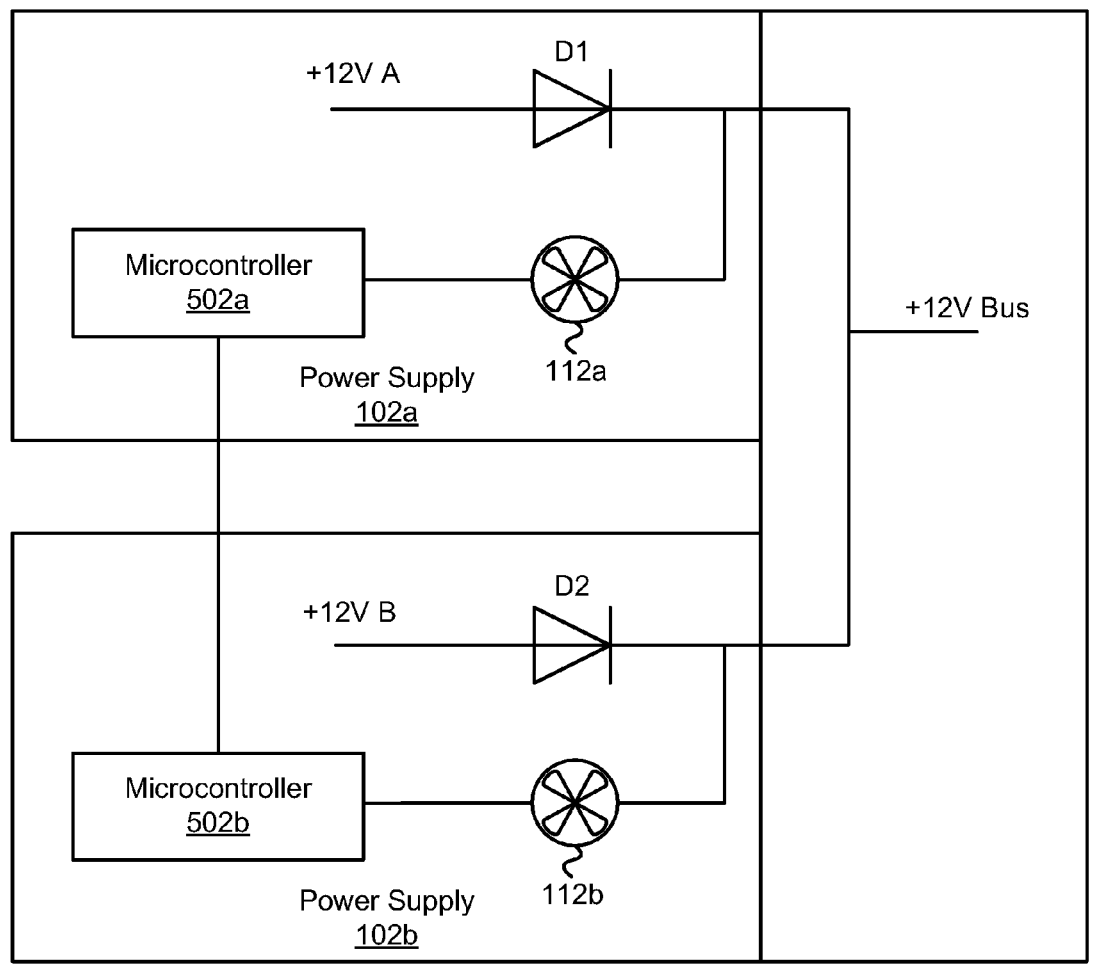
FIG. 5 is a second schematic block diagram illustrating one embodiment of an implementation of a power system with a cooling apparatus in accordance with the present invention.

FIG. 5 shows an additional implementation of a power system 500 according to the present invention. In the depicted embodiment, each power supply fan 112 similarly receives power from the common power bus (+12 V Bus). In this case each power supply fan 112 is assumed to have an integral controller 306 that receives both a power and a control signal. In the depicted embodiment, the cooling apparatus 110 is implemented in a microcontroller 510. The microcontroller 510 communicates fan speed parameters to the fan 112 according to the description above. In one embodiment, the fan controller 306 discussed above is also incorporated into the microcontroller 502 and the power signal could feed the microcontroller 502.

Similar to the connection in FIG. 4, the microcontrollers in FIG. 5 are interconnected to transmit fan control signal information. In this manner, the microcontroller receives a fan control signal and generates a pulse-width modulated fan drive signal. As in the embodiments described above, the fan drive signal causes the power supply fans 112 residing in each redundant power supply 102 to move at a speed corresponding to a duty cycle of the pulse-width modulated fan drive signal. In the depicted embodiment, each microcontroller may be powered by a common control bus such as a +5V bus.

Similar to the power supply fans 112 in the power system 400 in FIG. 4, the power supply fans 112 in FIG. 5 may be connected to transmit fan control information. In addition, although FIG. 5 depicts a single fan 112 in each power supply 102, each power supply 102 may include multiple fans 112.

Figure 6:
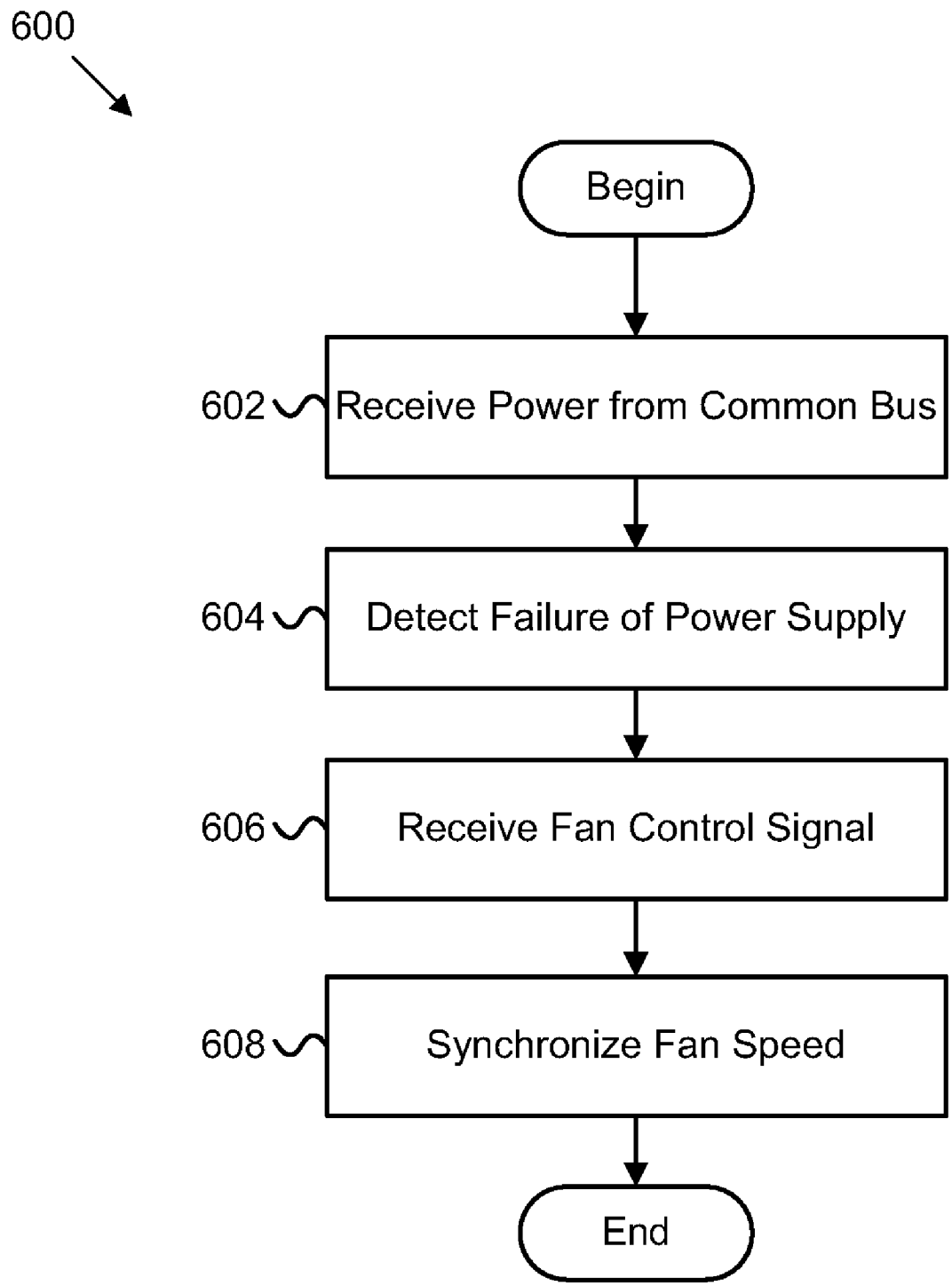
FIG. 6 is a schematic flow chart diagram illustrating one embodiment of a method for fault tolerant cooling in a redundant power system.

FIG. 6 illustrates a method for fault tolerant cooling in a redundant power system. The method includes receiving 602 power from a common power bus 114 to power one or more power supply fans 112. In one embodiment, this step is performed by the receiving module 204 and the fans 112 are PWM fans. Next, a non-functioning redundant power supply 102 is detected 604 by the detection module 208. The signal module 210 then receives 606 a fan control signal within the non-functioning redundant power supply 102. The fan control signal may convey pulse-width information, may be a full pulse-width signal, or may be the tachometer signal of a fan 112 in a functioning power supply 102. Furthermore, the fan control signal may be a master fan control signal that controls all fans 112 in the power system 106 or controls just the fans 112 in non-functioning redundant power supplies 102.

Then, the synchronization module 212 uses the received fan control signal to synchronize 608 a fan speed of one or more power supply fans 112 within the non-functioning redundant power supply 102. The synchronization module 212 may use the pulse-width information transmitted in the fan control signal to govern the fan speed of the one or more power supply fans 112 in the non-functioning redundant power supply 102. Alternatively, the synchronization module 212 may use a full pulse-width signal to operate the power supply fans 112 at the speed that the pulse-width signal dictates. In addition, the synchronization module 212 may also use a tachometer signal of a fan 112 in a functioning power supply 102 to implement a pulse-width modulated signal to control the speed of the fans 112 in the non-functioning power supply 102.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus for fault tolerant cooling in a redundant power system, the apparatus: comprising:
    a receiving module that receives power from a common power bus to power one or more pulse-width modulated (PWM) power supply fans, the common power bus receiving power from two or more redundant power supplies, the common power bus powering at least an electronic load and the one or more PWM power supply fans wherein each of the one or more PWM power supply fans cools at least a redundant power supply in which the PWM power supply fan resides and components within an electronic device, the components comprising the electronic load;
    a detection module that detects a non-functioning redundant power supply;
    a signal module that receives a fan control signal within a non-functioning redundant power supply wherein the fan control signal transmits pulse-width information and a fan controller of a PWM power supply fan uses the pulse-width information in the fan control signal to generate a pulse-width modulated fan drive signal, the fan drive signal causing the PWM power supply fan to move at a speed corresponding to a duty cycle of the pulse-width modulated signal; and
    a synchronization module that uses the received fan control signal to synchronize a fan speed of one or more PWM power supply fans within the non-functioning redundant power supply, the fan speed synchronized with at least one fan control signal of a PWM power supply fan within a functioning redundant power supply.

2. An apparatus for fault tolerant cooling in a redundant power system, the apparatus comprising:
    a receiving module that receives power from a common power bus to power one or more power supply fans, the common power bus receiving power from two or more redundant power supplies, the common power bus powering at least an electronic load and the one or more power supply fans wherein each of the one or more power supply fans cools at least a redundant power supply in which the power supply fan resides and components within an electronic device, the components comprising the electronic load;
    a detection module that detects a non-functioning redundant power supply;
    a signal module that receives a fan control signal within a non-functioning redundant power supply; and
    a synchronization module that uses the received fan control signal to synchronize a fan speed of one or more power supply fans within the non-functioning redundant power supply, the fan speed synchronized with at least one fan control signal of a power supply fan within a functioning redundant power supply.

3. The apparatus of claim 2, further comprising a switching module that switches to the received fan control signal such that the non-functioning redundant power supply uses the received fan control signal to govern fan speed of the one or more power supply fans in the non-functioning redundant power supply.

4. The apparatus of claim 2, wherein the received fan control signal comprises a master fan control signal, the master fan control signal synchronizes a fan speed of one or more power supply fans residing in one or more of the redundant power supplies.

5. The apparatus of claim 4, further comprising a designation module that designates a fan control signal of a power supply fan within a functioning redundant power supply as a master fan control signal in response to detecting a non-functioning redundant power supply, the non-functioning redundant power supply generating the master fan control signal prior to becoming non-functioning.

6. The apparatus of claim 5, wherein the non-functioning redundant power supply generating the master fan signal prior to becoming non-functioning receives the newly designated master fan control signal and uses the received master fan control signal to synchronize a fan speed one or more power supply fans within the non-functioning redundant power supply.

7. The apparatus of claim 2, wherein each power supply fan comprises a pulse-width modulated (PWM) fan.

8. The apparatus of claim 7, wherein the fan control signal transmits pulse-width information and a fan controller of a power supply fan uses the pulse-width information in the fan control signal to generate a pulse-width modulated fan drive signal, the fan drive signal causing the fan to move at a speed corresponding to a duty cycle of the pulse-width modulated signal.

9. The apparatus of claim 8, wherein the fan control signal comprises one of a digital signal and an analog signal.

10. The apparatus of claim 7, wherein the fan control signal comprises a pulse-width modulated fan drive signal, the fan drive signal causing the power supply fan to move at a speed corresponding to a duty cycle of the pulse-width modulated fan drive signal.

11. The apparatus of claim 2, wherein each redundant power supply comprises a microcontroller that receives a fan control signal and generates a pulse-width modulated fan drive signal, the fan drive signal causing the one or more power supply fans residing in each redundant power supply to move at a speed corresponding to a duty cycle of the pulse-width modulated fan drive signal.

12. A system for fault tolerant cooling in a redundant power system, the system comprising:
    an electronic device comprising one or more components, the components comprising an electronic load;
    a common power bus that receives power from two or more redundant power supplies, the common power bus powering at least an electronic load and one or more power supply fans;
    two or more redundant power supplies that receive input voltage from a power source and provide a regulated output voltage to the common power bus, each redundant power supply comprising one or more power supply fans, each redundant power supply comprising:

a receiving module that receives power from the common power bus to power one or more power supply fans wherein each of the one or more power supply fans cools at least a redundant power supply in which the power supply fan resides and components within the electronic device;

a detection module that detects a non-functioning redundant power supply;

a signal module that receives a fan control signal within a non-functioning redundant power supply; and a synchronization module that uses the received fan control signal to synchronize a fan speed of one or more power supply fans within the non-functioning redundant power supply, the fan speed synchronized with at least one fan control signal of a power supply fan within a functioning redundant power supply.

13. The system of claim 12, wherein each power supply fan comprises a pulse-width modulated (PWM) fan.

14. The system of claim 13, wherein the fan control signal transmits pulse-width information and a fan controller of a power supply fan uses the pulse-width information in the fan control signal to generate a pulse-width modulated fan drive signal, the fan drive signal causing the fan to move at a speed corresponding to a duty cycle of the pulse-width modulated signal.

15. The system of claim 14, wherein the fan control signal comprises one of a digital signal and an analog signal.

16. A method for fault tolerant cooling in a redundant power system, the method comprising:

receiving power from a common power bus to power one or more power supply fans, the common power bus receiving power from two or more redundant power supplies, the common power bus powering at least an electronic load and the one or more power supply fans wherein each of the one or more power supply fans cools at least a redundant power supply in which the power supply fan resides and components within an electronic device, the components comprising the electronic load;

detecting a non-functioning redundant power supply;

receiving a fan control signal within a non-functioning redundant power supply; and using the received fan control signal to synchronize a fan speed of one or more power supply fans within the non-functioning redundant power supply, the fan speed synchronized with at least one fan control signal of a power supply fan within a functioning redundant power supply.

17. The method of claim 16, further comprising switching to the received fan control signal such that the non-functioning redundant power supply uses the received fan control signal to govern fan speed of the one or more power supply fans in the non-functioning redundant power supply.

18. The method of claim 16, wherein the received fan control signal comprises a master fan control signal, the master fan control signal synchronizes a fan speed of one or more power supply fans residing in one or more of the redundant power supplies.

19. The method of claim 18, further comprising designating a fan control signal of a power supply fan within a functioning redundant power supply as a master fan control signal in response to detecting a non-functioning redundant power supply, the non-functioning redundant power supply generating the master fan control signal prior to becoming non-functioning.

20. The method of claim 19, wherein the non-functioning redundant power supply generating the master fan signal prior to becoming nonfunctioning receives the newly designated master fan control signal and uses the received master fan control signal to synchronize a fan speed one or more power supply fans within the non-functioning redundant power supply.

* * * * *